US008000371B2

(12) United States Patent
Strittmatter et al.

(10) Patent No.: US 8,000,371 B2
(45) Date of Patent: Aug. 16, 2011

(54) VERTICAL SURFACE EMITTING SEMICONDUCTOR DEVICE

(75) Inventors: Andre Strittmatter, Menlo Park, CA (US); Christopher L. Chua, San Jose, CA (US); Peter Kiesel, Palo Alto, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/564,264

(22) Filed: Sep. 22, 2009

(65) Prior Publication Data
US 2011/0069729 A1 Mar. 24, 2011

(51) Int. Cl.
*H01S 3/091* (2006.01)
(52) U.S. Cl. ............ 372/70; 372/71; 372/72; 372/75; 372/50.11
(58) Field of Classification Search ........... 372/70–72, 372/75, 50.11
See application file for complete search history.

(56) References Cited

U.S. PATENT DOCUMENTS

| | | | | |
|---|---|---|---|---|
| 2005/0100074 A1* | 5/2005 | Okazaki et al. | | 372/75 |
| 2008/0031289 A1* | 2/2008 | Cho et al. | | 372/22 |
| 2008/0112443 A1* | 5/2008 | Lee et al. | | 372/22 |

OTHER PUBLICATIONS

Schulz, N. et al., "Resonant In-Well Pumping of GaSb-Based VECSELs Emitting in the 2.X μm Wavelength Regime", Conference on Lasers and Electro-Optics/Quantum Electronics and Laser Science Conference and Photonic Applications Systems Technologies, OSA Technical Digest Series (CD) (Optical Society of America, 2007), paper CMFF6.

Schulz, N. et al., "Resonant optical in-well pumping of an (AlGaIn)(AsSb)-based vertical-external-cavity surface-emitting laser emitting at 2.35 micrometers", App Phys Let, vol. 91, 091113 (2007).

Lee, J, et al., "7 W high-efficiency continuous-wave green light generation by intracavity frequency doubling of an end-pumped vertical external-cavity surface emitting semiconductor laser", App Phys Let, vol. 89, 241107 (2006).

Schulz, N. et al., "An improved active region concept for highly efficient GaSb-based optically in-well pumped vertical-external-cavity surface-emitting lasers", App Phys Let, vol. 93, 181113 (2008).

"Publishable Final Activity Report", Nano-Photonics Materials and Technologies for Multicolor High-Power Sources (NATAL), IST-NMP 016769 (2008).

* cited by examiner

*Primary Examiner* — Tod T Van Roy
(74) *Attorney, Agent, or Firm* — Jonathan A. Small

(57) ABSTRACT

A semiconductor light emitting device includes a pump light source, a gain structure, and an out-coupling mirror. The gain structure is comprised of InGaN layers that have resonant excitation absorption at the pump wavelength. Light from the pump light source causes the gain structure to emit light, which is reflected by the out-coupling mirror back to the gain structure. A distributed Bragg reflector causes internal reflection within the gain structure. The out-coupling mirror permits light having sufficient energy to pass therethrough for use external to the device. A frequency doubling structure may be disposed between the gain structure and the out-coupling mirror. Output wavelengths in the deep-UV spectrum may be achieved.

11 Claims, 6 Drawing Sheets

VERTICAL SURFACE EMITTING SEMICONDUCTOR DEVICE

BACKGROUND

The present disclosure is related to solid state light emitting devices, and more specifically to laser devices emitting in the visible (e.g., 400 nm-550 nm) portion of the spectrum.

Solid state light emitting devices are known today, and are used in many different applications. For many such applications, the desired output wavelengths may be obtained from the devices themselves by current injection. For other such applications, the output of the light emitting device must be modified to obtain the desired wavelength. For example, in order to obtain output light in the deep-UV (e.g., 200 nm-300 nm), no single-chip, electrically driven device has been shown that provides adequate desired wavelength, power, beam quality, and lifespan. Deep-UV semiconductor-based laser devices that have been investigated so far are generally gallium-nitride-based ridge-waveguide laser diodes that inherently have low beam quality and exhibit low output power. Due to challenging materials issues in nearly every aspect of UV laser diodes, their lifetime is very limited.

To obtain deep-UV light, the light output by a solid state laser may be modified by a frequency doubling crystal. Efficient frequency-doubling by a non-linear crystal requires a coherent light source with high output power and Gaussian beam profile. Highest conversion efficiencies have been achieved when the non-linear crystal is placed in a resonator cavity using the enhanced optical field strength at the antinodes of a standing optical wave within the resonator (intracavity frequency doubling).

In order to achieve deep-UV emission by a single application of frequency doubling, nitride-based laser diodes emitting between 400 nm and 500 nm could be used. The available laser diodes in ridge-waveguide geometry, however, have an inherently low beam quality and are up to now limited in output power. Nitride-based VCSEL have only recently been reported with room-temperature operation and are anticipated to be low-power devices due to insufficient lateral current spreading impeding large area devices. Achieving deep-UV emission using a more widely available gallium-arsenide-based solid state laser effectively requires two applications of frequency doubling. However, the efficiencies of a two-stage frequency doubling significantly reduce output power and increase the size and complexity of the light-producing apparatus.

Recently, the concept of Vertical External-Cavity Semiconductor Lasers (VECSELs) or Semiconductor Disk Lasers (SDL) has been demonstrated as an efficient way for single-step frequency-doubling of near-infrared or red emission into the visible or near-UV spectral range. In SDLs, the excitation area and density are scaled by the diameter and power of an incident pump beam, and the pump power is absorbed over a length scale much larger than in electrically pumped lasers. Therefore, more optically active layers can be incorporated in the lasing process and consequently more output power can be obtained. For a given configuration, if not limited by thermal roll-over, the output power is limited only by the onset of catastrophic optical mirror damage (COMD). In a SDL, a resonator is formed between a semiconductor gain structure, which comprises the light emitting active region and a highly reflective Distributed Bragg Reflector (DBR) mirror, and an external mirror that is partially transparent for laser output. These devices are highly suitable for frequency doubling because of their inherent high beam quality ($M^2$~1), their high output power (multi-Watt operation) and their compatibility with intra-cavity frequency doubling. Intra-cavity frequency doubling takes advantage of the orders-of-magnitude higher field strength inside the cavity as compared to the field strength available in a tandem-cavities arrangement. Due to the quadratic dependence of the conversion effect on the optical field strength, intra-cavity frequency doubling yields higher optical output by second harmonic generation. A prerequisite for intra-cavity frequency doubling is having sufficient stability of the fundamental laser operation to withstand insertion of a non-linear optical crystal that inevitably introduces additional losses.

So far, the semiconductor gain structures being used are almost exclusively based on the gallium arsenide/aluminum gallium arsenide (GaAs/AlGaAs) system. Unlike most other semiconductor material systems the nearly strain-free GaAs/AlGaAs material system enables the growth of high-reflectivity multi-layer stacks out of GaAs/AlGaAs layers and the light emitting layers such as InGaAs quantum wells in a single epitaxial process. However, high-power deep-UV emission is reached only by two stages of frequency doubling from the fundamental infrared wavelength. Direct optical pumping of the quantum wells (QWs) in a SDL structure has also been demonstrated. This approach provides a reduced thermal load on the chip due to carrier relaxation processes and reduced energy deficit provided by the smaller difference of pump and SDL emission energies. However, direct absorption in QWs is inefficient due the small interaction length of the pump light and the QWs, and because of the non-resonant absorption leading to reduced oscillator-strength. If the microcavity exhibits fundamental resonance simultaneously at both the lasing wavelength and a secondary resonance at pump wavelength the absorption efficiency is greatly enhanced. This is achievable in two ways. One way is to use the shift of the resonance frequency of the microcavity towards shorter wavelengths for off-normal incidence angles. Another way is to use cavity thickness for which resonances exists at both the pump wavelength and the laser wavelength at normal incidence.

As compared to the simplicity of conventional laser diodes, SDLs are realized at the expense of an aligned optical setup comprising at least the pump laser diode, the semiconductor gain structure and the out-coupling mirror. The alignment of the setup basically comprises matching the pump laser spot to the width of the laser beam in the SDL cavity, which is determined by the curvature of the external mirror. However, this implies that the SDL apparatus is relatively large and sensitive to mechanical stress. For many applications, for example portable devices, compactness and robustness of the setup are important issues.

While there are motivators to extend what is currently known about arsenide-based systems to the nitride-based materials, there are many hurdles in doing so. Compact, high-power pump sources available to date have emission energies of 3.0 to 2.8 eV (405-445 nm wavelengths) which are lower than the GaN bandedge (3.4 eV). In addition, the energy deficit for pumping at 3.4 eV of a 2.7-2.6 eV emitting SDL amounts already to a 20% efficiency loss. Therefore, optical pumping at a high-power and above the GaN bandedge (similar to GaAs-based SDLs) is not practicable.

Using a pump source with bandedge energy (wavelength) below that of GaN requires that the gain structure be designed for resonant absorption at pump wavelength. As mentioned, this can be done in two ways (tilted incidence of pump light or particular choice of cavity thickness). However, depending on the available pump source wavelength with respect to the lasing wavelength of the SDL, one of either gain structure designs is favored for reasons of either simplicity of pump source-gain structure alignment or positioning of QWs within the gain structure.

GaN is the dominant matrix material in visible, nitride-based light emitters, and cannot be replaced easily by lower bandgap nitrides of sufficient thickness due to underlying growth mechanisms. Another key issue is the thermal management of the semiconductor chip to provide efficient cooling. Because nitrides are mechanically and chemically resistant materials and usually grown on similarly robust substrates like sapphire, the option of using known processes as for GaAs for substrate removal and re-bonding to a thermal heat sink are not available.

Yet another challenging problem for realization of a nitride-based VECSEL is the implementation of a highly reflecting multi-layer stack into the semiconductor structure chip during the epitaxial process. In order to achieve the required high reflectivity of 99.9% the required high number of strained AlGaN/GaN or unstrained InAlGaN/GaN layer pairs (e.g., greater than 60) will degrade the surface quality due to cracking or roughness and will eventually impair laser operation. Moreover, the width of the high reflectivity stop band of such epitaxially grown mirrors is rather small making it difficult to obtain high reflectivities both at pump wavelength and lasing wavelength.

Thus, while it is desirable to employ the techniques utilized in arsenide-based systems with nitride-based devices, hurdles including (a) large differences in materials properties between arsenide- and nitride-based systems, (b) limited availability of high-power pump sources, and (c) large differences in manufacturing of devices, mean that the simple substitution of material systems is not an option.

SUMMARY

Accordingly, the present disclosure is directed to a nitride-based SDL with wavelengths in the 400 nm to 550 nm spectral range. The present disclosure overcomes a number of challenges of merely extending what is known in the art relating to gallium-arsenide-based devices to nitride-based devices.

Therefore, disclosed herein is a nitride-based SDL design providing high-power, high-brilliance visible light emission that uses an indium-gallium-nitride (InGaN) semiconductor gain structure optimized for use with commercially available, high-power gallium nitride (GaN)-based laser diodes. In an alternate embodiment, the gain chip is optimized for use with commercially available high-brightness LEDs. The layout of the chip is very suitable for substrate removal processing. Therefore, an ultra-compact and easy to adjust deep-UV light emitting device is provided.

According to one aspect of the disclosure, a semiconductor gain structure is provided that is comprised of InGaN layers that have resonant absorption at the pump wavelength.

According to another aspect of the disclosure, the InGaN layers function as barriers around the QWs.

According to yet another aspect of the disclosure, the width and position of each individual InGaN layer within the layer stack yield maximum overlap with the standing wave pattern while obeying limitations due to strain.

According to still another aspect of the disclosure, a high-reflectivity multi-layer reflector is deposited on top of the semiconductor gain chip, and the width and position of each individual InGaN layer is according to a flip-chip design.

According to still another aspect of the disclosure, the total length of the semiconductor structure provides simultaneous resonance at lasing wavelength and pump wavelength under normal incidence conditions. This design may be chosen, for example, when the pump wavelength differs by more than 40 nm from the lasing wavelength.

According to still another aspect of the disclosure, the total length of the semiconductor structure provides simultaneous resonance at lasing wavelength of 460 nm and pump wavelength between 395 and 425 nm under normal incidence.

According to still another aspect of the disclosure, a dielectric multi-layer reflector is deposited on top of a semiconductor structure as previously described with high reflectivity of >99.9% at the lasing wavelength and low reflectivity <10% at the pump wavelength.

According to still another aspect of the disclosure, such dielectric mirror consists of 17.5-layer pairs of quarter-wavelength thickness at lasing wavelength having a refractive index contrast of approximately 0.21.

According to still another aspect of the disclosure, such dielectric multi-layer reflector consists of 17.5 layer pairs made of $SiO_2$ and $Si_3N_4$ quarter wavelength layers at the lasing wavelength.

According to still another aspect of the disclosure, such dielectric mirror consists of 17.5 or more pairs made of a 78 nm $SiO_2$ layer and a quarter-wavelength thick layer of $Si_3(O_xN_{1-x})_4$.

According to still another aspect of the disclosure, the total length of the semiconductor structure provides simultaneous resonance at lasing wavelength and pump wavelength under off-normal incidence conditions. This design may be chosen, for example, when the pump wavelength differs by less than 40 nm from the lasing wavelength.

According to still another aspect of the disclosure, the total length of the semiconductor structure provides simultaneous resonance at lasing wavelength of 460 nm and pump wavelength between 435 and 455 nm under off-normal incidence.

According to still another aspect of the disclosure, a dielectric multi-layer reflector is deposited on top of semiconductor structure as previously described with high reflectivity (e.g., at least 99.9%) at the lasing wavelength and high reflectivity (e.g., at least 99%) at the pump wavelength and off-normal incidence according to the resonance condition for the pump wavelength.

According to still another aspect of the disclosure, such a dielectric multi-layer reflector as described above consists of only 5.5 layer pairs of quarter wavelength thickness at the lasing wavelength with a refractive index contrast of approximately 0.39.

According to still another aspect of the disclosure, such a dielectric multi-layer reflector as described above consists of only 5.5 layer pairs of $TiO_2$ and $SiO_2$ quarter wavelength layers at the lasing wavelength.

According to still another aspect of the disclosure, a sacrificial InGaN layer is provided during device manufacturing, which may be etched away after removal of the growth substrate, which may for example be sapphire ($Al_2O_3$).

According to still another aspect of the disclosure, the upper interface of the sacrificial InGaN layer to the gain chip layer structure is at an anti-node position of the standing optical wave pattern at lasing wavelength.

According to still another aspect of the disclosure, an AlGaN layer is provided during device manufacturing, which may serve as an etch-stop layer for selective removal of the initially-grown GaN buffer layer after removal of the growth substrate, which may for example be sapphire ($Al_2O_3$).

According to still another aspect of the disclosure, the lower interface of the etch-stop AlGaN layer towards the substrate is at an anti-node position of the standing optical wave pattern at lasing wavelength According to yet another aspect of the disclosure, silicon may be used as the growth substrate enabling easy-to-use chemical processes for substrate removal.

According to a still further aspect of the disclosure, a thermally conductive, transparent substrate is used for growth of the semiconductor gain chip layer structure, which is polished and thinned and acts as a heatspreader for the semiconductor gain chip.

According to a still further aspect of the disclosure, silicon carbide or aluminum nitride (AlN) may be used as the thermally conductive substrate.

According to a still further aspect of the disclosure, if silicon carbide or aluminum nitride (AlN) are used as heatspreaders, the layer structure of the gain chip is as discussed above, with the added insertion of an epitaxially grown multi-layer stack made of AlGaN/GaN layers providing a reflectivity of at least 20% at pump wavelength at the position of an anti-node of the standing wave pattern for both the lasing and pump wavelength.

According to yet a still further aspect of the disclosure, the active layers may be formed over a GaN (1122)/m-Sapphire template or GaN(1122)-substrate for reduced polarization fields inside the active QW region.

According to an additional aspect of the disclosure, pillars may be etched in the InGaN semiconductor gain structure, increasing the accessible solid angle for pumping.

According to still another aspect of the disclosure, the semiconductor gain structure may be formed as a pillar, allowing lateral, large angle pumping of the structure.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well-known details are omitted so as not to unnecessarily obscure the details of the present invention. Thus, where details are otherwise well known, we leave it to the application of the present invention to suggest or dictate choices relating to those details.

Figure 1:
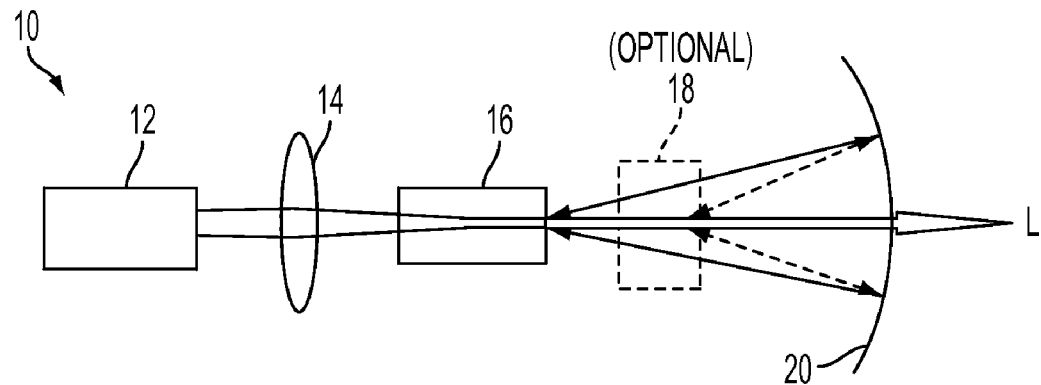
FIG. 1 is a schematic representation of a system for producing deep-UV light employing a nitride-based light source and semiconductor gain structure and a non-linear crystal according to a first embodiment of the present disclosure.

With reference now to FIG. 1, there is shown therein a schematic representation of a system 10 according to one embodiment of the present invention. Each element of system 10 is discussed in further detail below. System 10 comprises a pump beam source 12, the output of which is focused by focusing optics 14 onto a first facet of a semiconductor gain structure 16. The output of semiconductor gain structure 16 is directed toward concave out-coupling mirror 20, where more than 99% of light is reflected back onto semiconductor gain structure 16. This system 10 may optionally further comprise a non-linear crystal 18, which allows for generation of frequency-doubled light (applicable to all embodiments disclosed herein, but shown only in the embodiment of FIG. 1).

In one embodiment, pump beam source 12 is a commercially available, high-power gallium nitride (GaN)-based laser diode (or, alternatively, a plurality of laser diodes) emitting in the range of 370-425 nm, and in one specific embodiment, preferably at 405 nm. One example of such a source is disclosed in U.S. Pat. No. 7,547,925, incorporated herein by reference. The output power of pump beam source 12 may be in the range of 3-10 watts. A focusing system 14 consisting of one or more lenses is used to deliver a pump beam spot size of 50-200 μm diameter in order to achieve a power density of more than 50 kW/cm$^2$. The output of pump beam source 12 forms the optical pump driving semiconductor gain structure 16. Semiconductor gain structure 16 outputs a light beam at a desired wavelength, for example in the range of 440 nm-550 nm. Out-coupling mirror 20 is coated by dielectric layers in order to provide mirror reflectivity at the output wavelength of semiconductor gain structure of 99.5% or more.

Figure 2:
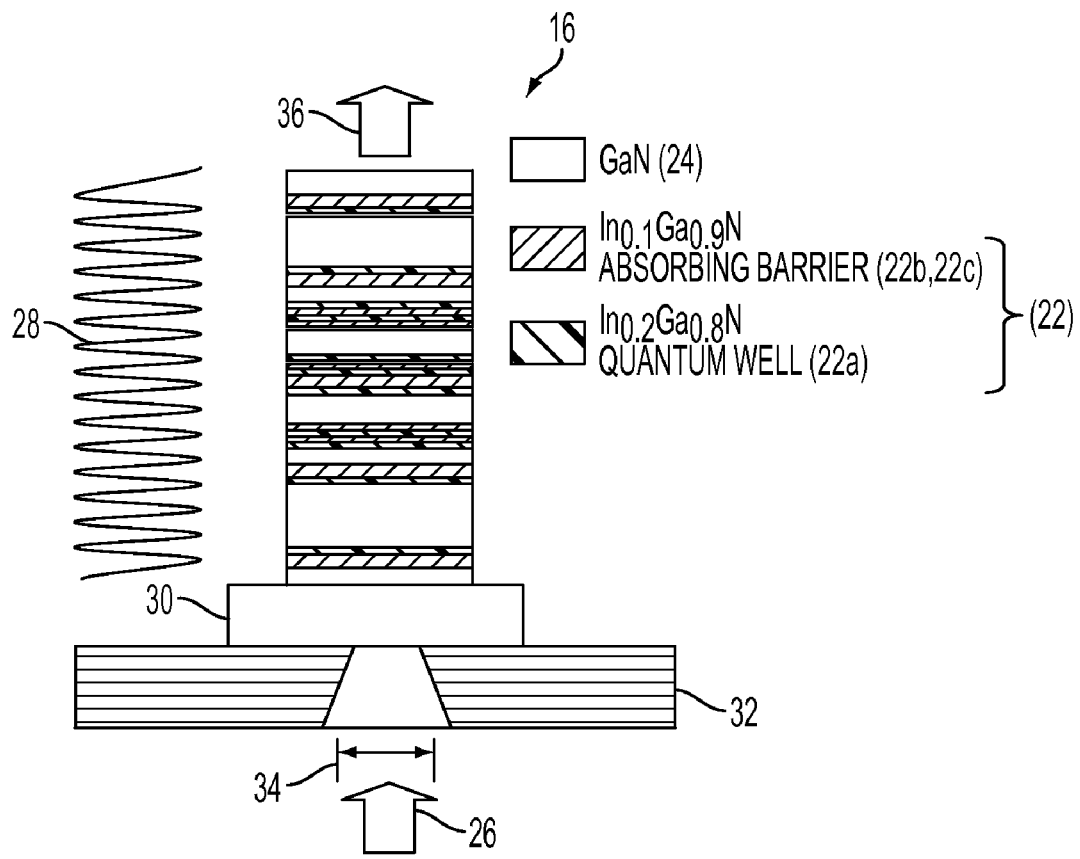
FIG. 2 is a cross-sectional view of a semiconductor gain structure according to a first embodiment of the present disclosure.

With reference next to FIG. 2, there is shown therein one embodiment of semiconductor gain structure 16. We focus first on the structure of semiconductor gain structure 16, and then present a brief overview of its production. In general, semiconductor gain structure 16 comprises a plurality of (e.g., 5-20) quantum well structures 22, each comprising a 2.5 nm $In_xGa_{1-x}N$ quantum well layer 22a, with $0.10 \leq x \leq 0.5$ and for example with x=0.2, and $In_yGa_{1-y}N$ pump-light absorber (PLA) barrier layers, with $0.0 \leq y \leq 0.4$ and for example with y=0.1, which are placed either below (22b) or on top (22c) of the QW layer 22a and are 5-25 nm thick. Diffusion blocking layers 24 of GaN are placed between quantum well structures 22, which serve to block charge carrier diffusion between individual quantum wells as well as to block charge carrier diffusion towards the surface of semiconductor gain structure 16. In general, the thickness of each GaN layer 24 are chosen in order to match the anti-node spacing of both pump and lasing wave train. The spacing between adjacent quantum well structures 22 therefore depends on its relative position within the gain structure 16. Moreover, whether PLA barrier layers below (22c) or above (22b) the quantum well layer 22a is employed also depends on the relative position of the standing wave patterns 28a and 28b of the laser beam 36 and the pump beam 26. A beam 26 provided by pump beam source 12 pumps semiconductor gain structure 16. Beam 26 forms a standing wave 28 within semiconductor gain structure 16. Quantum well structures 22 are spaced apart from one another such that the $In_{0.2}Ga_{0.8}N$ quantum well layer 22a of each is located at an anti-node position of the standing wave pattern 28a of the laser beam 36.

Gain structure 16, comprised of a total of N layers, has an optical thickness, OT, which is an integer multiple of the pump wavelength and lasing wavelength and determined as:

$$\sum_{0}^{N} (thickness_n)(refractive\ index_n),$$

where the layers n include quantum well, barrier, and diffusion layers. That is, gain structure 16 has a thickness which is the sum of the product of the thickness of each layer multiplied by that layer's refractive index and also an integer multiple of the pump wavelength and lasing wavelength.

As previously mentioned, if the semiconductor gain structure's sub-cavity (the quantum well and barrier regions) exhibits fundamental resonance simultaneously at the lasing wavelength and a secondary resonance at pump wavelength the absorption efficiency is greatly enhanced. In order to make the gain structure resonant simultaneously at two distinct wavelengths, the total length of the gain structure's sub-cavity divided by the quotient of the wavelengths in the media (for example $(405/n_1)/(460/n_2)$) must be as close as possible to an integer number.

Semiconductor gain structure 16 further comprises a dielectric distributed Bragg reflector (DBR) structure 32 adjacent the epitaxially grown nitride layers 24. In one embodiment, DBR 30 consists of 17.5 pairs of 59 nm $SiN_x$/78 nm $SiO_2$ quarter wavelength layers yielding 99.9% reflectivity at 460 nm.

With regard to the manufacture of semiconductor gain structure 16, the semiconductor layers 22a-c, 24, and DBR 30 can be grown on a substrate (not shown) which is transparent at the wavelengths of the pump light, such as sapphire, by metalorganic vapor phase epitaxy (MOVPE), for example as disclosed and described in the aforementioned U.S. Pat. No. 7,547,925.

It is known that during operation the semiconductor gain chip can become quite hot. In order to reduce heat-induced damage or performance loss, the semiconductor gain structure 16 including DBR 30 is mounted topside down onto a first heat sink 32a. Heat sink 32a may, for example, be comprised of copper or other heat-conducting material. Laser lift-off (LLO) is then performed to remove the substrate, for example as disclosed and described in U.S. Pat. No. 6,757,314, which is incorporated by reference herein. A second heat sink 32b is then mounted to the exposed backside of the gain structure. The completed structure is shown inverted in FIG. 2, with heat sink 32a and 32b at the bottom and the top thereof.

Heat sink 32a has a small opening 34 for backside pumping of the semiconductor gain structure 16. Heat sink 32b has a small opening of same diameter as heat sink 32a. The openings are centered above each other. Pumping of the chip parallel to the surface normal is thereby possible (that is, pump beam source 12 and semiconductor gain structure 16 may be co-axially aligned), enabling a linear arrangement of all optical parts of the structure, as illustrated in FIG. 1.

Finally, the coating of the external out-coupling mirror 20 is designed to yield 99.5% reflectivity at 460 nm and 99% at 405 nm. Thereby, at least a second roundtrip of the pump wavelength is facilitated to enhance absorption efficiency of the PLAs.

Detailed Example 1

Following is a specific example of the steps and conditions for forming first a semiconductor gain structure, and second a complete light emitting device according to one embodiment of the present disclosure. According to this example, total cavity length is chosen to have about 14λ/2 lengths at 405 nm pump wavelength, which corresponds to 12λ/2 lengths at 460 nm lasing wavelength (lasing wavelength is generally in the range of 460 nm-500 nm). Thereby, 11 light-emitting InGaN layers and PLAs can be incorporated while being placed at anti-nodes of the standing wave pattern for light with 405 nm pump wavelength or with 460 nm lasing wavelength.

Epitaxial growth is carried out using metalorganic vapor phase deposition (MOCVD) using c-plane sapphire as substrate. The substrate is annealed in hydrogen atmosphere at approximately 1050° C. for 5 minutes for surface cleaning. A 15 nm-20 nm thick GaN (or AlN) nucleation layer is next deposited at approximately 550° C. This is followed by an 8-micron thick GaN layer grown at 1060° C. yielding an atomically smooth layer with line defect densities of $10^8\ cm^{-2}$ or less. Such surface and material quality may be achieved using other methods (such as molecular beam epitaxy, hydride vapor phase epitaxy etc.) and/or using other substrates like bulk GaN, SiC, Si etc. In the case of bulk GaN, a nucleation layer is not needed, and the growth starts with an 8 μm thick GaN layer grown at 1060° C. However, the details of the semiconductor gain structure are substantially the same regardless of the specific method used or substrate employed.

The gain structure fabrication sequence starts with a 20 nm $Al_{0.1}Ga_{0.9}N$ etch stop layer grown at T>1000° C. This layer enables selective wet-etching of the GaN buffer layer after substrate lift-off. The layer sequence proceeds as follows:

60 nm GaN grown at T>1050° C.
20 nm $In_{0.1}Ga_{0.9}N$ layer at T=750° C.
2.5 nm $In_{0.2}Ga_{0.8}N$ layer at T=750° C.
15 nm GaN layer at T=750° C.
275 nm GaN at T=875° C.
2.5 nm $In_{0.2}Ga_{0.8}N$ layer at T=750° C.
20 nm $In_{0.1}Ga_{0.9}N$ layer at T=750° C.
11 nm GaN layer at T=750° C.
25 nm GaN layer at T=875° C.
2.5 nm $In_{0.2}Ga_{0.8}N$ layer at 750° C.
10 nm $In_{0.1}Ga_{0.9}N$ layer at 750° C.
2.5 nm $In_{0.2}Ga_{0.8}N$ layer at 750° C.
10 nm $In_{0.1}Ga_{0.9}N$ layer at 750° C.
15 nm GaN layer at 750° C.
45 nm GaN layer at 875° C.
2.5 nm $In_{0.2}Ga_{0.8}N$ layer at T=750° C.
10 nm $In_{0.1}Ga_{0.9}N$ layer at T=750° C.
2.5 nm $In_{0.2}Ga_{0.8}N$ layer at T=750° C.
10 nm $In_{0.1}Ga_{0.9}N$ layer at T=750° C.
2.5 nm $In_{0.2}Ga_{0.8}N$ layer at T=750° C.
15 nm GaN layer at 750° C.
40 nm GaN layer at 875° C.
10 nm $In_{0.1}Ga_{0.9}N$ layer at T=750° C.

2.5 nm $In_{0.2}Ga_{0.8}N$ layer at T=750° C.
10 nm $In_{0.1}Ga_{0.9}N$ layer at T=750° C.
2.5 nm $In_{0.2}Ga_{0.8}N$ layer at T=750° C.
15 nm GaN layer at T=750° C.
50 nm GaN layer at T=875° C. 20 nm $In_{0.1}Ga_{0.9}N$ layer at T=750° C.
2.5 nm $In_{0.2}Ga_{0.8}N$ layer at T=750° C.
15 nm GaN at T=750° C.
275 nm GaN at T=875° C.
2.5 nm $In_{0.2}Ga_{0.8}N$ layer at T=750° C.
20 nm $In_{0.1}Ga_{0.9}N$ layer at T=750° C.
15 nm GaN at T=750° C.
45 nm GaN at T=750° C.

A distributed Bragg reflector (DBR) comprising 17.5 periods of 78 nm nm $Si_3N_4$ is then formed on top of the periodic gain medium using known methods such as electron beam evaporation (EBE) and sputtering. This DBR has a reflectivity greater than 99.9% at a wavelength of 460 nm and lower than 5% in the wavelength range of 405 nm-410 nm so that the pump light can penetrate into the semiconductor gain structure where it may be absorbed. In general, the DBR may have a reflectivity of at least 99.9% to light at a wavelength between 440 nm and 550 nm and a reflectivity lower than 5% to light in the wavelength range of 370 nm-425 nm.

The semiconductor gain structure, with its DBR-side down, is mounted on a copper heat sink using materials and processes as described, for example, in U.S. Pat. No. 6,562,648, which is incorporated herein by reference. The copper sub-mount has proper dimensions to facilitate mounting on active cooling devices, such a Peltier cooler. Additionally, both the sub-mount and the cooling devices have via holes of 1 mm diameter for pump light transmission.

The sapphire substrate is then removed by laser lift-off as described in the aforementioned U.S. Pat. No. 6,562,648 and in U.S. Pat. No. 6,617,261, which is also incorporated herein by reference. In the case of GaN substrates, the substrate is mechanically thinned down to 50 μm thickness. The exposed backside is polished by a process such that described by Weyher et al. in J. Cryst. Growth, Volume 182, Number 1, December 1997, pp. 17-22(6), which is incorporated herein by reference, to below 1 nm rms roughness. Thereafter, the original GaN buffer layer is etched away using UV-enhanced wet-chemical etching in KOH at 80° C. down to the $Al_{0.1}Ga_{0.9}N$ etch stop layer (ESL).

A copper plate having a via hole of 1 mm diameter is clamped against the backside of the semiconductor gain structure in such a way that the hole is aligned with the hole in the copper sub-mount. The copper plate has appropriate connections to the Peltier-cooled copper sub-mount. Thereby, cooling may also be provided to the backside of the semiconductor gain structure. The complete chip-holder is then fixed in all spatial dimensions onto the cooling device.

An out-coupling mirror and the gain structure are aligned on the same optical axis with the focal point of the out-coupling mirror laying on the surface of gain structure. The reflectivity of the out-coupling mirror is 99.5% for light at 460 nm. The radius of curvature of the out-coupling mirror is chosen to provide a spot size of the laser beam on the gain structure equal to the spot size of the pump beam. Thereby, losses due to parasitic pumping of unused gain structure area are avoided. One or more pump lasers with wavelength of 405 nm and coupled to one or more fibers are separately mounted and electrically controlled. The fiber output is fixed on the backside of the gain structure module (comprising the gain structure itself, the sub mount, the front cooling plate, and the cooling device) on the same optical axis as the out-coupling mirror and the gain structure. A lens is used to focus the pump light on the gain structure through the via holes. The focal length of the lens is chosen in order to match the corresponding spot size of the pump beam to the spot size of the laser beam on the gain structure at the gain structure surface pointing towards the out-coupling mirror.

The setup may comprise further elements to shape the output of the laser device. Such elements include, but are not limited to frequency-doubling nonlinear crystals to convert visible light into deep-UV light, wavelength-selective elements such as etalons or gratings to obtain single-frequency operation, or saturable absorbers for mode-locking, which may be inserted between the semiconductor gain chip and the outcoupling mirror.

It will thus be appreciated that this first embodiment provides a compact, robust device utilizing a nitride-based materials system that enables the insertion of frequency-conversion elements such as non-linear crystals to generate deep UV light output. A number of variations of the above embodiment will also be apparent. For example, DBR 30 may be epitaxially grown over the nitride layers, and/or may be comprised of different materials and have different layer- and overall-thickness. The materials and dimensions of the quantum well structure layers 22a, barrier layers 22b-c, and charge carrier diffusion layers 24 may differ from that disclosed above, and indeed may vary within a single structure from one layer to the next. Furthermore, the wavelengths of the pump source 12 and output of the device 16 may differ from that disclosed above. In addition, the heat-sink 32 bonded to the top surface of the structure may be formed of material other than copper.

Figure 3:
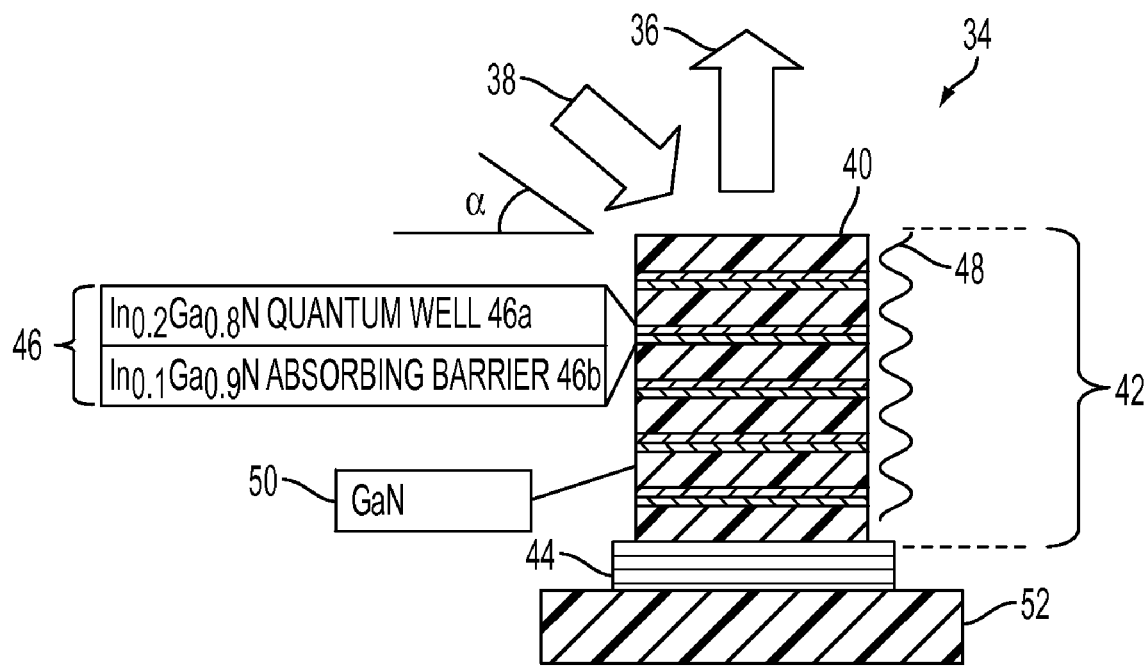
FIG. 3 is a cross-sectional view of a semiconductor gain structure according to a second embodiment of the present disclosure.

In another embodiment of the present disclosure, a device 34 is provided in which pump beam source 12 and semiconductor gain structure 16 are aligned such that they are not co-axial (the pump beam is incident on the gain structure other than parallel to the gain structure's primary optical axis). This embodiment is illustrated in FIG. 3. This second embodiment uses resonantly enhanced absorption, as employed in Resonant-Cavity-Enhanced photodetectors (RCE-PD) for example, as a means for enhanced absorption of pump light in the quantum well structures 22. In order to have a resonant cavity effect at 445 nm, pump light 38 is caused to be incident onto surface 40 of structure 34 at an appropriate angle α that reduces the effective optical path length of the semiconductor sub-cavity 42 and shifts the stop band of a distributed Bragg reflector structure 44 towards shorter wavelengths by which the resulting standing wave pattern matches to the positions of the InGaN PLAs. In this embodiment, distributed Bragg reflector (DBR) 44 may comprise 6-and-one-half periods of 38 nm $TiO_2$/78 nm $SiO_2$ formed on top of the periodic gain medium using known methods such as EBE and sputtering. This DBR has a reflectivity greater than 99.9% at a wavelength of 460 nm. The stop band continuously shifts towards shorter wavelengths with increasing incidence angle of the light. Thereby, the resonantly enhanced absorption effect can take advantage of a highly reflecting mirror.

In one embodiment, the gain structure sub-cavity has an optical thickness measured along its primary optical (lasing) axis which is equal to an integer multiple of the lasing wavelength (in a range between 400 nm to 550 nm) and an optical thickness measured along a primary optical (pumping) axis inclined to the primary optical (lasing) axis which is equal to an integer multiple of the pumping wavelength, where the pumping wavelength is shorter than the lasing wavelength by at most 40 nm.

Within the semiconductor gain chip 5-20 $In_xGa_{1-x}N$ quantum wells 46a with $x_{In}$=20% and 2.5 nm width are placed at the anti-node positions of the standing wave pattern 48 evolving in the semiconductor sub-cavity 42. Each quantum well layer 46a is formed on top of $In_yGa_{1-y}N$ pump-light absorber (PLA) barrier layer 46b with $y_{ln}$=15% and 11.5 nm thickness. Diffusion blocking layers 50 of GaN are placed between quantum well structures 46, which serve to block charge carrier diffusion between individual quantum wells as well as to block charge carrier diffusion towards the surface of semiconductor gain structure 34. The layers of semiconductor sub-cavity 42 can be grown on a substrate, such as sapphire, which is transparent at the wavelength of the pump light by metalorganic vapor phase epitaxy (MOVPE), as previously discussed.

Again, for improved dissipation of the heat generated by structure 34 in operation, the semiconductor sub-cavity 42 including the dielectric DBR 44 is transferred topside-down onto a heat sink 52 such as copper. A laser lift-off (LLO) process may then be performed, as previously discussed, to remove the substrate.

The coating of the external out-coupling mirror 20 (FIG. 1) is made to reflect 99.5% of incident light at 460 nm. For resonantly enhanced absorption of the pump light, the incidence angle α of the pump light is set to about 30-50 degrees with respect to surface 40 (i.e., 30-50 degrees with respect to the surface normal). Thereby, the effective optical cavity length shortens and becomes resonant at a wavelength of 445 nm.

Figure 4:
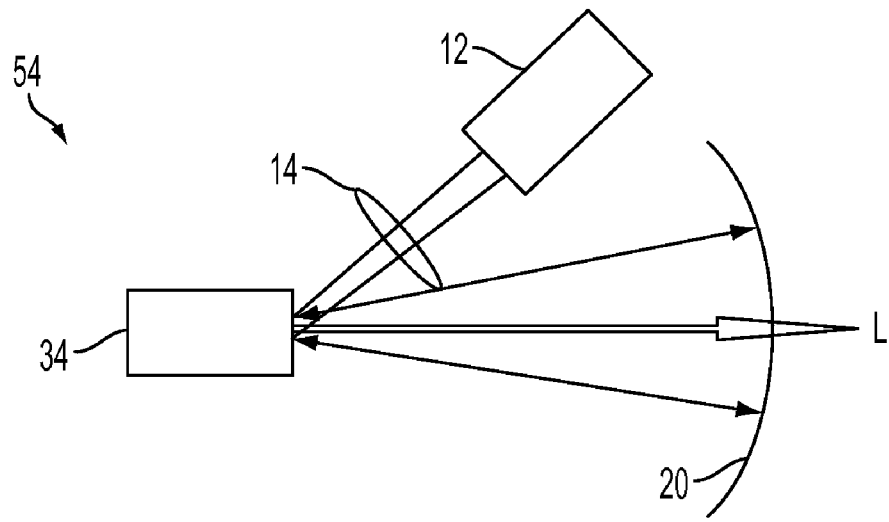
FIG. 4 is a schematic representation of a system for producing deep-UV light employing a nitride-based light source and semiconductor gain structure according to a second embodiment of the present disclosure.

With reference to FIG. 4, there is shown therein a schematic representation of a system 54 according to one embodiment of the present invention. System 54 comprises a pump beam source 12, of the type previously discussed, emitting light at for example 445 nm used to pump a semiconductor gain structure. Pump beam source 12 and focusing optics 14 are positioned relative to semiconductor gain structure 34 (described above) such that the output of pump beam source 12 is focused by focusing optics 14 onto a first facet of semiconductor gain structure 34 at approximately 30-50 degrees relative to the that first facet (i.e., approximately 40 degrees to normal). The output of semiconductor gain structure 34 is directed toward concave out-coupling mirror 20 where more than 99% of light is reflected back onto semiconductor gain structure 16. This system 54 may optionally further comprise a non-linear crystal 18, which allows for generation of frequency-doubled light.

Figure 5:
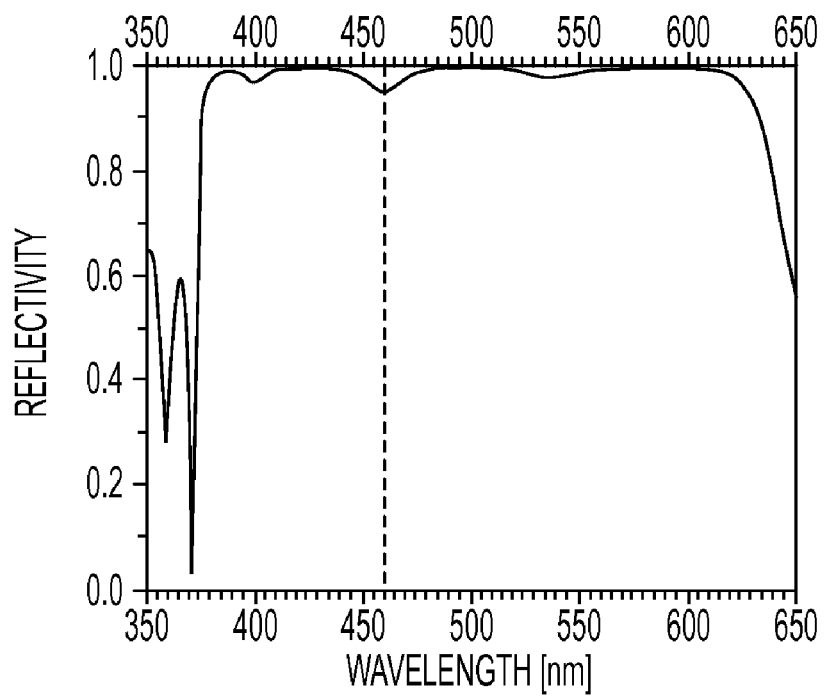
FIG. 5 is a graph of modeled results for the reflectivity spectra for pump light incident normal to a semiconductor gain structure surface according to the first embodiment of the present disclosure.
Figure 6:
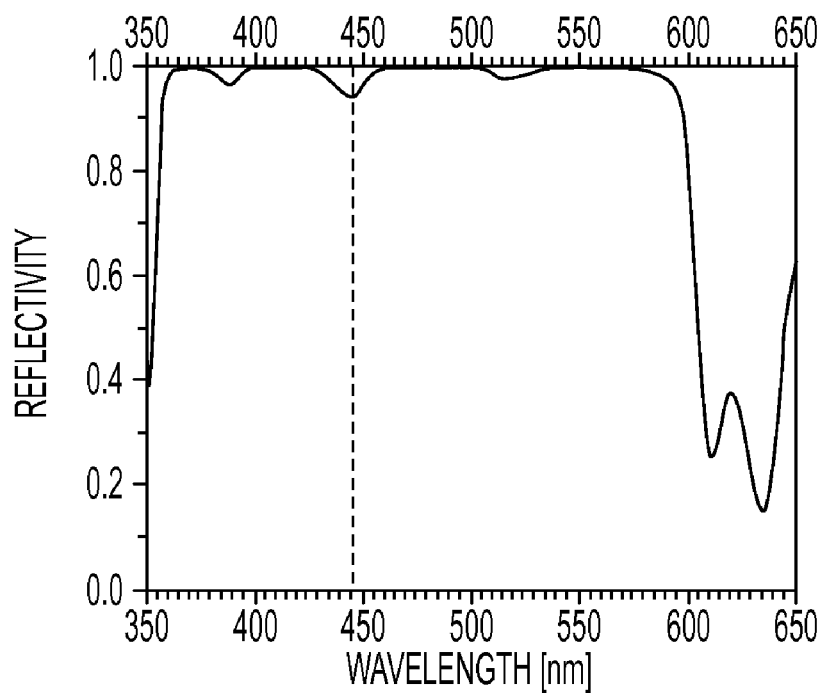
FIG. 6 is a graph of modeled results for the reflectivity spectra for pump light incident at approximately 40 degrees to surface normal to a semiconductor gain structure surface according to the second embodiment of the present disclosure.

Reflectivity spectra for pump light incident normal to the semiconductor gain structure surface (i.e., structure 10 including device 16) is illustrated by the modeled result shown in FIG. 5. Reflectivity spectra for pump light incident at 40 degrees to surface normal of the semiconductor gain structure (i.e., structure 54 including device 34) is illustrated by the modeled results shown in FIG. 6.

This second embodiment also provides a potentially more compact overall structure as the optics are effectively "folded" as compared to the first embodiment. A number of variations of the above embodiment will also be apparent. For example, DBR 52 may be epitaxially grown over the nitride layers, and/or may be comprised of different materials and have different layer- and overall-thickness. The materials and dimensions of the quantum well structure layers 46a, barrier layers 46b-c, and charge carrier diffusion layers 50 may differ from that disclosed above, and indeed may vary within a single structure from one layer to the next. Furthermore, the wavelengths of the pump source 12 and output of the device 54 may differ from that disclosed above. The angle of incidence of pump beam 38 may be more or less than 30-50 degrees to surface normal. In addition, the heat-sink 32 bonded to the top surface of the structure may be formed of material other than copper.

Detailed Example 2

In this specific example, the total cavity length is chosen to have 10λ/2 lengths at 460 nm. Thereby, 20 light-emitting InGaN layers and PLAs can be incorporated while being placed at anti-nodes of the standing wave pattern for light with 460 nm lasing wavelength.

Epitaxial growth is carried out using metalorganic vapor phase deposition (MOCVD) using c-plane sapphire as substrate. The substrate is annealed in hydrogen atmosphere at 1050° C. for 5 minutes for surface cleaning. Then, a 15-20 nm thick GaN (or AlN) nucleation layer is deposited at 550° C. This is followed by an 8 μm thick GaN layer grown at 1060° C., yielding an atomically smooth layer with line defect densities of $10^8$ cm$^{-2}$ or less.

Such surface and material quality may be achieved using other methods (such as molecular beam epitaxy, hydride vapor phase epitaxy, etc.) and/or using other substrates such as bulk GaN, SiC, Si etc. In the case of bulk GaN, a nucleation layer is not needed, and the growth starts with an 8 μm thick GaN layer grown at 1060° C. However, the details of the semiconductor gain structure are substantially the same regardless of the specific method used or substrate employed.

The structure formation process starts with a 20 nm thick $Al_{0.1}Ga_{0.9}N$ etch stop layer (ESL) grown at T>1000° C. This layer enables selective wet-etching of the GaN buffer layer after substrate lift-off. The layer sequence proceeds as follows:

65 nm GaN grown at T>1050° C.
9 repetitions of:
    2.5 nm $In_{0.15}Ga_{0.8}N$ layer at T=750° C.
    11.5 nm $In_{0.15}Ga_{0.8}N$ layer at T=750° C.
    2.5 nm $In_{0.15}Ga_{0.8}N$ layer at T=750° C.
    11.5 nm $In_{0.2}Ga_{0.8}N$ layer at T=750° C.
    15 nm GaN layer at T=750° C.
    50 nm GaN layer at T=875° C.
and after the periodic structure
2.5 nm $In_{0.15}Ga_{0.8}N$ layer at T=750° C.
11.5 nm $In_{0.15}Ga_{0.8}N$ layer at T=750° C.
2.5 nm $In_{0.15}Ga_{0.8}N$ layer at T=750° C.
11.5 nm $In_{0.2}Ga_{0.8}N$ layer at T=750° C.
20 nm GaN layer at T=750° C.

On top of the gain structure so deposited, a distributed Bragg reflector (DBR) is formed comprising 6-and-one-half periods of 38 nm $TiO_2$/78 nm $SiO_2$ using known methods such as EBE and sputtering. This DBR has a reflectivity greater than 99.9% at a wavelength of 460 nm. The entire structure has a resonance at 445 nm for an incidence angle of 35 degrees.

The semiconductor gain structure with its DBR-side down is mounted on a copper sub-mount heat sink using materials and processes such as described in U.S. Pat. No. 6,562,648. The copper sub-mount has proper dimensions to facilitate mounting of active cooling devices such as a Peltier cooler.

The sapphire substrate is then removed by laser lift-off as described in U.S. Pat. No. 6,562,648 B1 and U.S. Pat. No. 6,617,261 B2. In case of GaN substrates, the substrate is mechanically thinned down to 50 μm thickness. The exposed backside is polished by processes as described by Weyher et al. in J. Cryst. Growth, Volume 182, Number 1, December 1997, pp. 17-22(6) to below 1 nm rms roughness. Subsequently, the original GaN buffer layer is etched away using UV-enhanced wet-chemical etching in KOH at 80° C. down to the $Al_{0.1}Ga_{0.90}N$ etch stop layer (ESL).

A copper plate having a via hole of 1 mm diameter is clamped against the backside of the chip. The copper plate has appropriate connections to the Peltier-cooled copper submount. Thereby, cooling is provided to the backside as well. The complete chip-holder is then fixed in all spatial dimensions onto the cooling device.

The out-coupling mirror (OCM) and the gain chip (GC) are aligned on the same optical axis with the focal point of (OCM) laying on the surface of GC. The radius of curvature of the OC is chosen to provide a spot size of the laser beam on the GC equal to the spot size of the pump beam. Thereby, losses due to parasitic pumping of unused GC area are avoided. One or more pump lasers with wavelength of 445 nm and coupled to one or more fibers are separately mounted and electrically controlled. The fiber output is fixed in front of exposed area of the gain chip module under an angle of 35 degrees with regard to the optical axis of the OCM and the gain chip. A lens is used to focus the pump light on the gain chip through the via hole of the clamped copper plate. The focus length of the lens is chosen in order to match the corresponding spot size of the pump laser to the spot size of the VECSEL laser mode on the gain chip at the chip surface. The reflectivity of the OCM is 99.5% at 460 nm wavelength.

Figure 7:
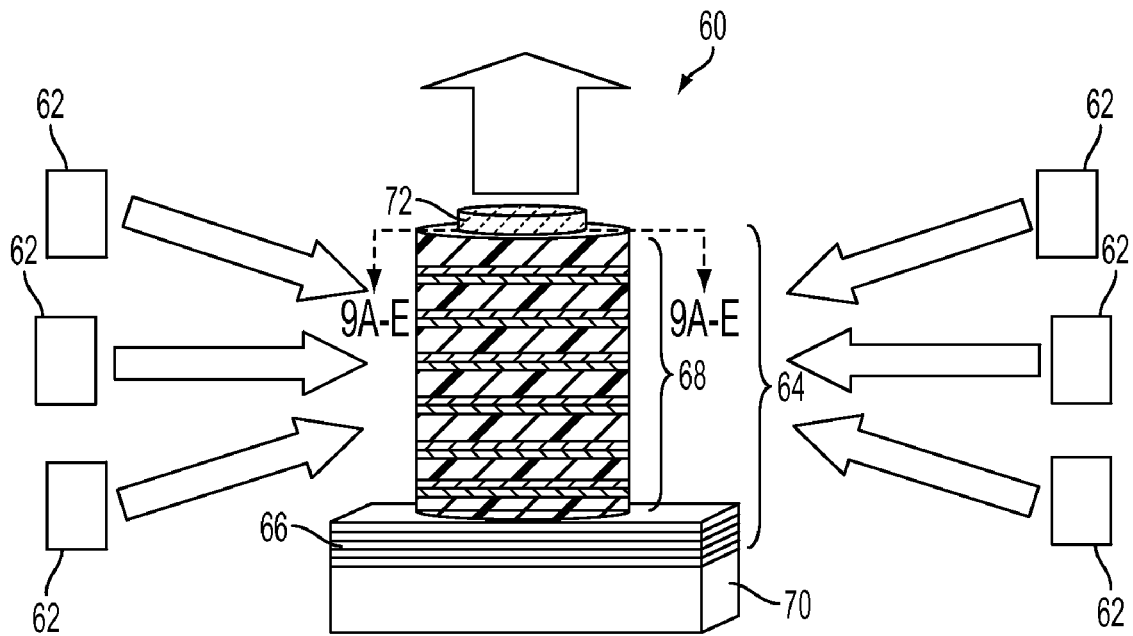
FIG. 7 is a cross-sectional view of a semiconductor gain structure according to a third embodiment of the present disclosure.
Figure 8:
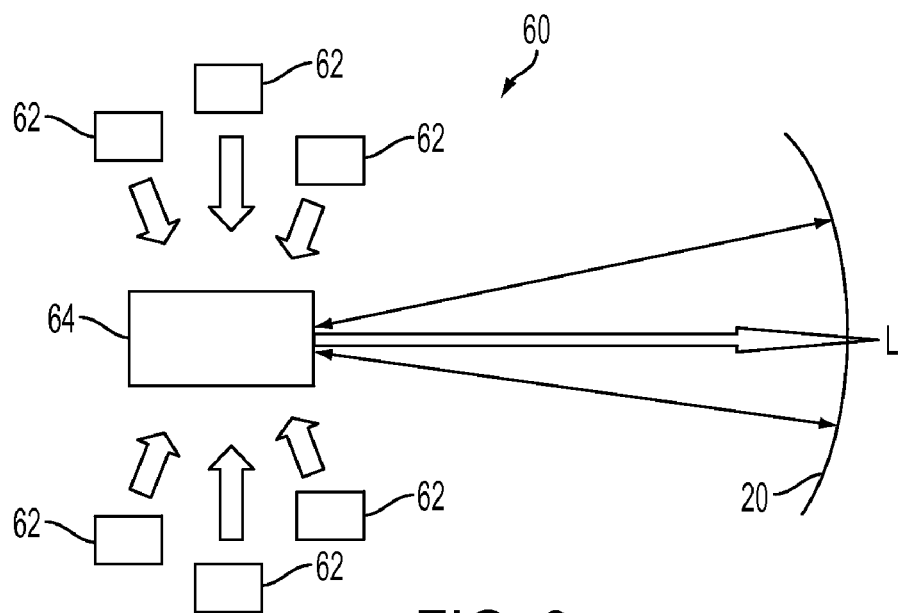
FIG. 8 is a schematic representation of a system for producing deep-UV light employing a plurality of light sources and a semiconductor gain structure according to a third embodiment of the present disclosure.

In yet another embodiment, a device 60 is provided in which a plurality of pump sources 62, such as high-brightness light emitting diodes (HB-LEDs) are assembled around optically semiconductor gain structure 64 formed as a pillar structure. This embodiment is illustrated in FIGS. 7, 8, and 9. As previously described, semiconductor gain structure 64 comprises a highly reflecting DBR mirror 66, a semiconductor sub-cavity 68 consisting of, for example, 10 quantum well structures of a type previously discussed. For example, each quantum well structure may comprise 2 periods of an 11.5 nm $In_{0.10}Ga_{0.90}N$ PLA layer and an $In_xGa_{1-x}N$ quantum well layer with $x_{In}=20\%$ and 2.5 nm width placed at an anti-node position of the standing wave pattern evolving in the semiconductor sub-cavity 68. Diffusion blocking layers of 74 nm GaN are formed between the quantum well structures, which serve to block charge carrier diffusion between individual quantum wells as well as to block charge carrier diffusion towards the surface of semiconductor gain structure 64. The layers of semiconductor sub-cavity 68 can be grown by, for example, metalorganic vapor phase epitaxy (MOVPE). In this configuration, the sub-cavity total length is chosen to be resonant at lasing wavelength, for example at 460 nm.

Heat generated by structure 64 in operation may be dissipated by a heat sink 70, such as a copper plate, to which semiconductor sub-cavity 68 and DBR 66 are secured. A laser lift-off (LLO) process may be used to remove the substrate on which semiconductor sub-cavity 68 and DBR 66 are originally fabricated.

Figure 9A:
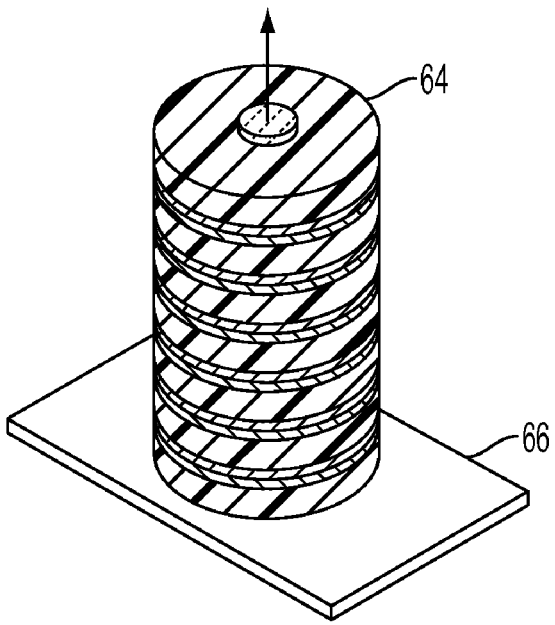
FIGS. 9A through 9E are cross-sections of a semiconductor gain structure according to various embodiments of the present disclosure.
Figure 9B:
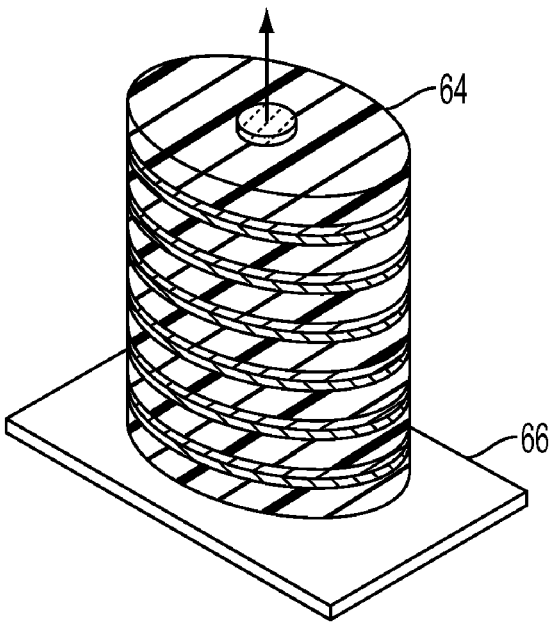
Figure 9C:
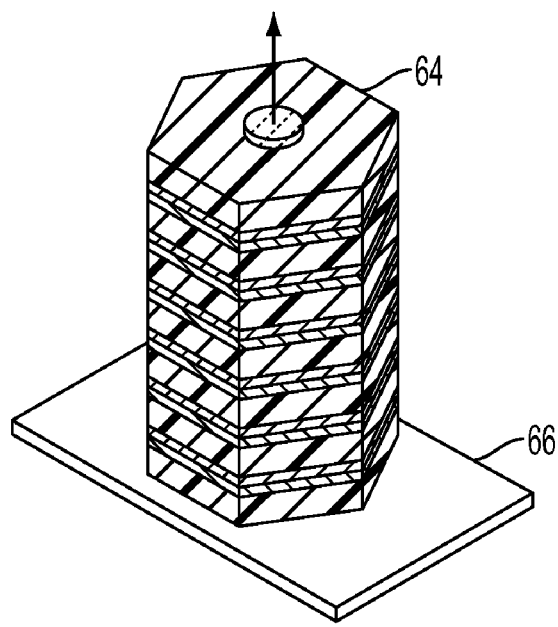
Figure 9D:
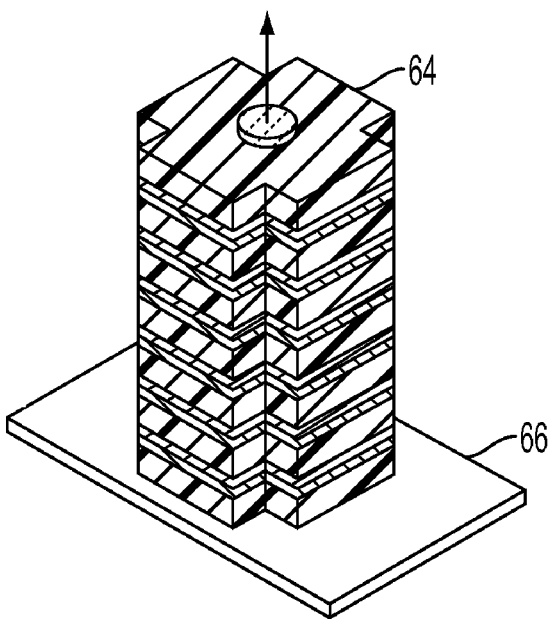
Figure 9E:
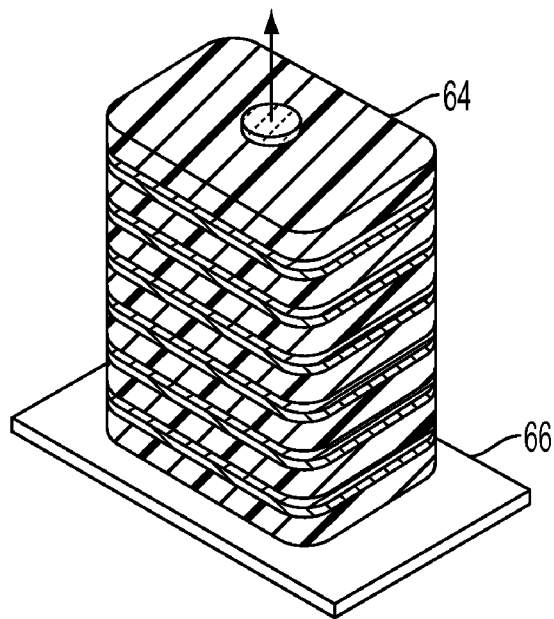

In contrast to prior described embodiments, semiconductor sub-cavity 68 is etched by chemical assisted ion beam etching (or other appropriate process) to yield a pillar-like structure of, for instance, 200 mm diameter with an exposed sidewall. This allows for a large solid angle to be accessed for pumping with pump sources 62 (e.g., high-brightness LEDs). The light output of the LEDs is collimated and focused onto the post-like semiconductor sub-cavity 68. In one embodiment, the cross-section of semiconductor sub-cavity 68 (viewed axially) may be circular, as illustrated in FIG. 9A. However, many other rectangular and non-rectangular cross sections are possible given the above disclosure, such as those illustrated for example in FIGS. 9B-9E (which illustrate the scope of this aspect of the invention, but are not intended to limit the various cross-sections which may be employed).

Detailed Example 3

In this example, the total cavity length is chosen to have $6\lambda/2$ lengths at 460 nm. Thereby, a vertical waveguide is formed between the DBR structure and the semiconductor-air interface.

Epitaxial growth is carried out using metalorganic vapor phase deposition (MOCVD) using c-plane sapphire as substrate. The substrate is annealed in hydrogen atmosphere at 1050° C. for 5 minutes for surface cleaning. Then, a 15-20 nm thick GaN (or AlN) nucleation layer is deposited at 550° C. This is followed by an 8 μm thick GaN layer grown at 1060° C. yielding an atomically smooth layer with line defect densities of $10^8$ $cm^{-2}$ or less.

Such surface and material quality may be achieved using other methods (such as molecular beam epitaxy, hydride vapor phase epitaxy, etc.) and/or using other substrates such as bulk GaN, SiC, Si etc. In the case of bulk GaN, a nucleation layer is not needed, and the growth starts with an 8 μm thick GaN layer grown at 1060° C. However, the details of the semiconductor gain structure are substantially the same regardless of the specific method used or substrate employed.

The semiconductor gain structure sub-cavity layer sequence starts with a 20 nm $Al_{0.1}Ga_{0.9}N$ etch stop layer grown at T>1000° C. This layer enables selective wet-etching of the GaN buffer layer after substrate lift-off. The layer sequence proceeds as follows:

65 nm GaN grown at T>1050° C.
4 repetitions of:
2.5 nm $In_{0.2}Ga_{0.8}N$ layer at T=750° C.
11.5 nm $In_{0.1}Ga_{0.9}N$ layer at T=750° C.
2.5 nm $In_{0.2}Ga_{0.8}N$ layer at T=750° C.
11.5 nm $In_{0.1}Ga_{0.9}N$ layer at T=750° C.
15 nm GaN layer at T=750° C.
50 nm GaN layer at T=875° C.
and after the periodic structure
2.5 nm $In_{0.2}Ga_{0.8}N$ layer at T=750° C.
11.5 nm $In_{0.1}Ga_{0.9}N$ layer at T=750° C.
2.5 nm $In_{0.2}Ga_{0.8}N$ layer at T=750° C.
11.5 nm $In_{0.1}Ga_{0.9}N$ layer at T=750° C.
20 nm GaN layer at T=750° C.

A transparent distributed Bragg reflector (DBR) comprising 6-and-a-half periods of 38 nm $TiO_2$/78 nm $SiO_2$ is formed on top of the periodic gain medium using a known method such as PECVD and thermal evaporation. This DBR has a reflectivity greater than 99.9% at a wavelength of 460 nm.

The semiconductor chip with its DBR-side down is mounted on a copper heat sink using materials and processes as described in U.S. Pat. No. 6,562,648. The copper submount has proper dimensions to facilitate mounting on active cooling devices such as a Peltier cooler. The sapphire substrate is then removed by laser lift-off as described in U.S. Pat. Nos. 6,562,648 and 6,617,261. In the case of GaN substrates, the substrate is mechanically thinned down to a thickness of 50 mm. The exposed backside is then polished by processes such as described by Weyher et al. in J. Cryst. Growth, Volume 182, Number 1, December 1997, pp. 17-22(6) to below 1 nm rms roughness. Thereafter, the original GaN buffer layer is etched away using UV-enhanced wet-chemical etching in KOH at 80° C. down to the $Al_{0.1}Ga_{0.9}N$ etch stop layer (ESL).

On the upper surface of the gain structure sub-cavity, a circular area is defined of diameter equal to the spot size of the laser beam, as defined by the out-coupling mirror properties (e.g., radius of curvature). This is done by spin coating of 4 μm of photoresist (for example AZ 1518), and subsequently exposing the whole chip area except for the mesa region, which forms an etch mask. The exposed area is then etched using chlorine-based dry etching techniques such as chemical assisted ion beam etching (CAIBE) or reactive ion etching (RIE). The etching is stopped upon reaching the DBR structure. Optionally, the sidewalls may be coated with an anti-reflection coating (for example with a $SiO_2$ layer with quarter wavelength thickness according to the pump wavelength)

using plasma-enhanced chemical vapor deposition or atomic layer deposition tools. The complete chip-holder is then fixed in all spatial dimensions onto the cooling device.

The out-coupling mirror and the gain structure are aligned on the same optical axis, with the focal point of the out-coupling mirror falling on the surface of the gain structure. The radius of curvature of the out-coupling mirror is chosen to provide a spot size of the laser beam on the gain structure approximately equal to the area of the top surface of the gain structure pillar. Losses due to parasitic pumping of unused gain structure area are thereby avoided. The reflectivity of the out-coupling mirror is 99.5% for light at 460 nm. A plurality of pump lasers for emitting light at 405 nm are separately mounted around the circumference of the gain structure pillar and electrically controlled. Each laser is focused onto the sidewalls of the pillar structure using lenses.

A number of variations of the above embodiment are contemplated. These variations include, but are not limited to different post diameters for semiconductor sub-cavity 68, employing alternative pump sources, such as laser diodes, a range of pump source wavelengths, pump sources as LEDs with directional output, such as Resonant cavity LEDs, use of tantalum pentoxide ($Ta_2O_5$) for a portion or all of the DBR, etc. Given the above disclosure one skilled in the art appreciate other such variations and specifically optimized parameters to their specific application which are within the scope of the present disclosure.

According to one variation of the above-described embodiments, the $Al_{0.1}Ga_{0.9}N$ etch stop layer may be replaced with a 50-100 nm thick InGaN sacrificial layer between the buffer layer of, for example (Al,Ga)N, and the periodic quantum well structures. After removal (e.g., by laser-lift-off) of the growth substrate and definition of a mesa structure 72 by photolithography and vertical etching, the buffer layer damaged by the substrate removal process is itself removed by laterally etching away the InGaN layer using a process similar to Stonas et al., Appl. Phys. Lett. 78, 1945 (2001). The preferred mesa structure is circular with rectangular side-walls. The mesa diameter is in the range of 50 μm-1000 μm in order to match with the spot size of the lasing beam as defined by the outcoupling mirror.

According to the above, one growth regime is to grow the semiconducting and related layers over a sapphire growth substrate. However, alternate substrates may be employed. In one embodiment, the alternate substrate is comprised of crystalline silicon. In this embodiment, in addition to formation of the semiconductor gain structure as described above, a plurality of thin AlN/GaN layers are formed in the buffer layer structure in order to introduce compressive strain at growth temperature which compensates for the thermal strain built up during cooling down to room temperature as described in Dadgar et al., Phys. Stat. Sol. (c) 0, No. 6, 1583-1606 (2003). Such layers are inserted at specific locations in order to maintain the proper standing wave pattern matched to the QW positions. After growth, suitable acids can be used to selectively chemically remove the Si substrate.

Other alternate substrates are semi-polar (in particular GaN(1013), GaN(1122), and GaN(2021)) and non-polar GaN (in particular GaN(1010)), which may also include a sapphire template. Such orientations allow for different strain relaxation mechanisms than GaN(0001) substrates and, therefore, cracking of $GaN/Al_xGa_{1-x}N$-DBR structures can be avoided. Thereby, gain structures formed on semi-polar or non-polar substrates may permit skipping the step of removing the substrate by including a monolithically integrated epitaxial $GaN/Al_xGa_{1-x}N$-DBR structure. Some adjustment to the individual layer thicknesses of the quantum well structures and other elements of the semiconductor gain structure are contemplated, as compared to the above disclosed structures, due to reduced polarization fields and inverted signs for the strain regarding AlGaN and InGaN as compared to GaN (0001) substrates, as well as due to different refractive indices for the layers of GaN and sapphire.

Further alternate substrates may also be employed, such as SiC or AlN. For these substrate materials, in addition to the previously mentioned steps of forming the semiconductor gain structure, the backside of the substrate requires polishing after growth in order to obtain a mirror-like surface. The substrate in these embodiments acts as heat sink. Therefore, the high-reflectivity DBR is located on top of the epitaxially grown structure. It is preferred to use a dielectric DBR deposited after epitaxial growth, since epitaxial DBRs grown on top of the active region are likely to be of inferior quality and detrimental to the active region.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternatives thereof, may be desirably combined into many other different systems or applications, which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A semiconductor gain structure to be used in an optically pumped laser system, said system including a laser pump for emitting a pump beam at a pump wavelength, comprising:
    a heat sink;
    a distributed non-epitaxial Bragg reflector structure disposed over said heat sink, said distributed non-epitaxial Bragg reflector having a reflectivity of at least 99.9% to light at a wavelength between 440 nm and 550 nm and a reflectivity lower than 5% to light in the wavelength range of 370 nm-425 nm; and
    a gain structure disposed over said distributed Bragg reflector structure, comprising at least gallium nitride and having formed therein a plurality of quantum well structures which are the primary pump light absorbing elements in the gain structure, each said quantum well structure comprising a quantum well layer of substantially $In_xGa_{1-x}N$ with $0.10 \times 0.5$ disposed between upper and lower layers of substantially $In_yGa_{1-y}N$ with $0.0 < y \leq 0.4$ said gain structure having a thickness which is the sum of the product of the thickness of each layer comprising said gain structure multiplied by that layer's refractive index and also an integer multiple of the pump wavelength and lasing wavelength;

said quantum well layers arranged in groups selected from single, double, and triple quantum well groups, to thereby form at least a portion of a gain structure sub-cavity, said gain structure sub-cavity having a primary optical axis;

each said quantum well group located at and generally centered on an anti-node of a standing wave pattern of a beam at the lasing wavelength of the semiconductor gain structure determined by the local overlap between the anti-nodes of standing wave patterns at the pump wavelength and lasing wavelength along an axis of and within said semiconductor gain structure.

2. The semiconductor gain structure of claim 1, wherein said heat sink is provided with an opening extending entirely therethrough such that a pump light beam may travel in said opening and be incident upon a bottom surface of said gain structure sub-cavity substantially parallel to said gain structure primary optical axis.

3. The semiconductor gain structure of claim 2, wherein a growth substrate upon which said gain structure sub-cavity and said distributed Bragg reflector structure were formed has been removed.

4. The semiconductor gain structure of claim 1, wherein said gain structure sub-cavity has an optical thickness measured along said primary optical axis equal to an integer multiple of a wavelength, $\lambda$, of substantially 405 nm.

5. The semiconductor gain structure of claim 1, wherein said distributed Bragg reflector structure comprises alternating layers of silicon nitride ($Si_3N_4$) and silicon oxide ($SiO_2$).

6. The semiconductor gain structure of claim 1, wherein said pump beam is incident on said gain structure at an angle other than parallel to said gain chip primary optical axis.

7. The semiconductor gain structure of claim 6, wherein said gain structure sub-cavity has an optical thickness measured along said primary optical axis which is equal to an integer multiple of a first wavelength in a range between 400 nm to 550 nm and an optical thickness measured along an axis inclined to said primary optical axis which is equal to an integer multiple of a second wavelength, said second wavelength being shorter than said first wavelength by at most 40 nm.

8. The semiconductor gain structure of claim 7, wherein said first wavelength is in a range of 460-500 nm and said second wavelength has a wavelength, $\lambda$, of substantially 445 nm.

9. The semiconductor gain structure of claim 1, wherein said gain structure sub-cavity has a non-rectangular cross section.

10. A light emitting device, comprising:
a pump light source;
a semiconductor gain structure having a thickness which is the sum of the product of the thickness of each layer comprising said gain structure multiplied by that layer's refractive index and also an integer multiple of the wavelength of said pump light source and a lasing wavelength of said light emitting device, said semiconductor gain structure comprising:
a heat sink;
a distributed Bragg reflector structure disposed over said heat sink, said distributed Bragg reflector structure having a reflectivity of at least 99.9% to light at a wavelength between 440 nm and 550 nm and a reflectivity lower than 5% to light in the wavelength range of 370 nm-425 nm; and
a gain structure sub-cavity disposed over said distributed Bragg reflector structure and having an upper and lower facet, said gain structure sub-cavity comprising at least gallium nitride or a related compound and having formed therein a plurality of quantum well structures, each said quantum well structure comprising a quantum well layer of substantially $In_xGa1-xN$ with $0.10 \leq x \leq 0.5$ disposed between upper and lower layers of substantially $In_yGa1-yN$ with $0.0 < y \leq 0.4$;
said quantum well layers arranged in groups selected from single, double, and triple quantum well groups to thereby define a primary optical axis;
each said quantum well group located at and generally centered on an anti-node of a standing wave pattern of a beam at a lasing wavelength of the semiconductor gain structure determined by the local overlap between the anti-nodes of standing wave patterns at the pump wavelength and lasing wavelength; and
a concave out-coupling mirror at least 99.5% reflective of light at 440 nm-550 nm and substantially more transmissive to light at wavelengths shorter than 300 nm;
whereby said a heat sink has formed therein an opening extending entirely therethrough and further whereby said pump light source is disposed relative to said gain structure sub-cavity such that a light beam emitted by said pump light source may travel in said opening and be incident upon said lower facet of said gain structure sub-cavity along said primary optical axis to thereby cause said gain structure sub-cavity to emit light, and further such that a light beam caused to be emitted by said gain structure sub-cavity thereby exits said gain structure sub-cavity at said upper facet thereof in a beam path along said primary optical axis, and still further whereby said gain structure sub-cavity is disposed relative to said concave out-coupling mirror such that light emitted by said gain structure sub-cavity is made incident on said concave out-coupling mirror and reflected thereby onto said upper facet of said gain structure sub-cavity to thereby cause said gain structure sub-cavity to further emit light.

11. The light emitting device of claim 10, further including a frequency doubling crystal structure disposed in the beam path between said gain structure sub-cavity upper facet and said concave out-coupling mirror.

* * * * *